(12) United States Patent
Komori et al.

(10) Patent No.: US 8,941,004 B2
(45) Date of Patent: Jan. 27, 2015

(54) SOLAR CELL ELEMENT

(71) Applicant: Panasonic Corporation, Osaka (JP)

(72) Inventors: Tomoyuki Komori, Osaka (JP); Eiji Fujii, Osaka (JP); Tetsuya Asano, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/068,364

(22) Filed: Oct. 31, 2013

(65) Prior Publication Data

US 2014/0053900 A1 Feb. 27, 2014

Related U.S. Application Data

(63) Continuation of application No. PCT/JP2013/000023, filed on Jan. 9, 2013.

(30) Foreign Application Priority Data

Jan. 11, 2012 (JP) .................................. 2012-002730

(51) Int. Cl.
*H01L 31/0224* (2006.01)
*H01L 31/02* (2006.01)
(Continued)

(52) U.S. Cl.
CPC .. *H01L 31/022425* (2013.01); *H01L 31/02008* (2013.01); *H01L 31/022466* (2013.01); *H01L 31/0524* (2013.01); *H01L 31/0693* (2013.01); Y02E 10/50 (2013.01)
USPC .............. 136/256; 136/252; 438/72

(58) Field of Classification Search
USPC ...................... 136/256, 252; 438/72
See application file for complete search history.

(56) References Cited

U.S. PATENT DOCUMENTS 6,558,817 B1 5/2003 Ueda et al.
7,291,782 B2 * 11/2007 Sager et al. ................... 136/250
(Continued)

FOREIGN PATENT DOCUMENTS

JP 56-114384 B2 9/1981
JP 61-043870 B2 9/1986
(Continued)

OTHER PUBLICATIONS

International Search Report issued in PCT/JP2013/000023, dated Mar. 12, 2013.
Nelson, Jenny: "The Physics of Solar Cells", 2003, pp. 11-13.

*Primary Examiner* — Golam Mowla
(74) *Attorney, Agent, or Firm* — McDermott Will & Emery LLP (57) ABSTRACT

A solar cell element comprising a p-side electrode; a p-type group III-group V compound semiconductor layer; an n-type group III-group V compound semiconductor layer; an n-side group III-group V compound electrode layer; and a $V_xZn_{1-x}$ layer. The p-side electrode is electrically connected to the p-type group III-group V compound semiconductor layer. The p-type group III-group V compound semiconductor layer, the n-type group III-group V compound semiconductor layer, the n-side group III-group V compound electrode layer, and the $V_xZn_{1-x}$ layer are stacked in this order. The $V_xZn_{1-x}$ layer is in contact with the n-side group III-group V compound electrode layer; x represents a value of not less than 0.3 and not more than 0.99; and the $V_xZn_{1-x}$ layer has a thickness of not less than 1 nanometer and not more than 5 nanometers.

4 Claims, 8 Drawing Sheets

(51) Int. Cl.
*H01L 31/052* (2014.01)
*H01L 31/0693* (2012.01)

(56) References Cited

U.S. PATENT DOCUMENTS

| | | | | |
|---|---|---|---|---|
| 7,462,774 | B2 * | 12/2008 | Roscheisen et al. | 136/256 |
| 7,511,217 | B1 * | 3/2009 | Roscheisen et al. | 136/263 |
| 2005/0121068 | A1 * | 6/2005 | Sager et al. | 136/252 |
| 2010/0320446 | A1 | 12/2010 | Kang et al. | |
| 2012/0266954 | A1 | 10/2012 | Seike et al. | |

FOREIGN PATENT DOCUMENTS

| | | |
|---|---|---|
| JP | 2000-091078 A | 3/2000 |
| JP | 2000-091607 A | 3/2000 |
| JP | 2001-052877 A | 2/2001 |
| JP | 2008-124381 A | 5/2008 |
| JP | 2010-518557 A | 5/2010 |
| JP | 2010-283208 A | 12/2010 |
| JP | 2011-119678 A | 6/2011 |

* cited by examiner

| | |
|---|---|
| *h* | 21.8 % |
| Isc | 6.74E-05 A |
| Jsc | 26.9 mA/cm$^2$ |
| Voc | 0.98 V |
| Vmax | 0.84 V |
| Imax | 6.47E-05 A |
| FF | 83.0 % |

SOLAR CELL ELEMENT

This is a continuation of International Application No. PCT/JP2013/000023, with an international filing date of Jan. 9, 2013, which claims priority of Japanese Patent Application No. 2012-002730 filed on Jan. 11, 2012, the contents of which are hereby incorporated by reference.

TECHNICAL FIELD

The present disclosure relates to a solar cell element.

BACKGROUND ART

Figure 10:
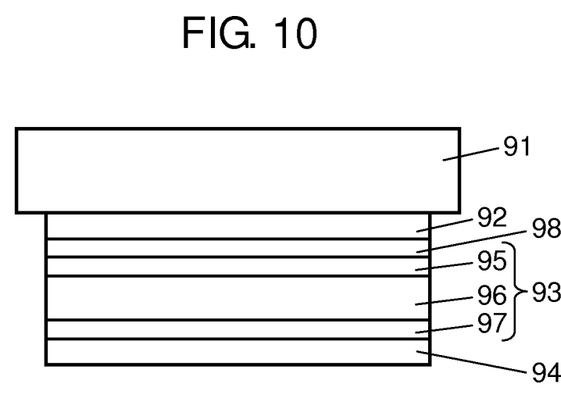
FIG. 10 shows a solar cell element disclosed in Patent Literature 1.

FIG. 10 shows a solar cell element disclosed in Patent Literature 1. This solar cell element comprises a glass substrate 91, a first transparent conductive film 92, a metallic thin film 98, a p-type layer 95, an I-type layer 96, an n-type layer 97 and a second transparent conductive film 94 in this order. The metallic thin film 98 has a high work function. The incident light travels to the layers 95-97 through the glass substrate 91. Examples of the material of the metallic thin film 98 include rhodium, iridium, gold, palladium, and nickel. The metallic thin film 98 has a thickness of 1-10 nanometers.

Figure 11:
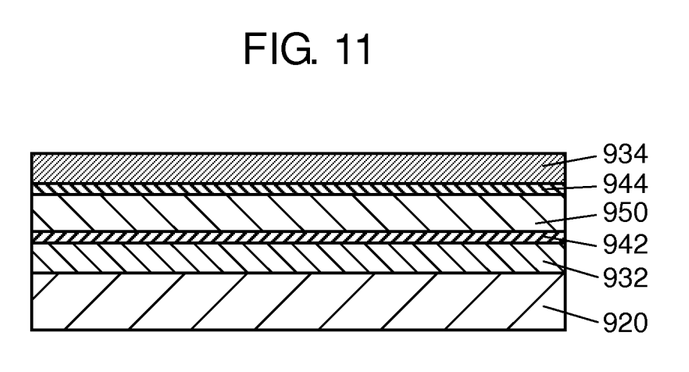
FIG. 11 shows an organic solar cell element disclosed in Patent Literature 2.

FIG. 11 shows an organic solar cell element disclosed in Patent Literature 2. This solar cell element comprises a substrate 920, a first electrode 932, a first metal layer 942, an active layer 950, a second metal layer 944, and a second electrode 934 in this order. Examples of the materials of the first electrode 932 and the second electrode 934 include indium oxide, zinc oxide, tin oxide, and a mixture thereof. The first metal layer 942 has a work function of not less than 3.7 eV and not more than 5.5 eV. An oxide of the first metal layer 942 has a semiconductor property. The first metal layer 942 has a thickness of 2 nanometers-50 nanometers. Examples of the material of the first metal layer 942 include zinc, tin, titanium, and niobium. The second metal layer 944 is the same as the first metal layer 942.

Patent Literature 3, Patent Literature 4, and Patent Literature 5 disclose that vanadium, copper, zinc, gold, chrome, cobalt, nickel, iron, tungsten, silver, tin, titanium, palladium, platinum and alloys thereof have a high work function.

CITATION LIST

Patent Literatures

Patent Literature 1: Japanese Patent Publication No. Sho 61-043870
Patent Literature 2: Japanese Patent Laid-Open Publication No. 2011-119678
Patent Literature 3: Japanese Patent Laid-Open Publication No. 2000-091078 (see paragraph 0023)
Patent Literature 4: Japanese Patent Laid-Open Publication No. 2010-518557 (see paragraph 0035)
Patent Literature 5: Japanese Patent Laid-Open Publication No. 2001-052877 (see paragraph 0030)

Non Patent Literature

Non Patent Literature 1: Jenny Nelson (2003), The physics of Solar Cells, Imperial college press, pp. 11-13.

SUMMARY OF INVENTION

Technical Problem

An object of the present disclosure is to provide a new solar cell element having higher photoelectric conversion efficiency.

Solution to Problem

The present disclosure provides a solar cell element comprising:
- a p-side electrode 53;
- a p-type group III-group V compound semiconductor layer 31;
- an n-type group III-group V compound semiconductor layer 32;
- an n-side group III-group V compound electrode layer 4; and
- a $V_xZn_{1-x}$ layer 51; wherein
- the p-side electrode 53 is electrically connected to the p-type group III-group V compound semiconductor layer 31;
- the p-type group III-group V compound semiconductor layer 31, the n-type group III-group V compound semiconductor layer 32, the n-side group III-group V compound electrode layer 4, and the $V_xZn_{1-x}$ layer 51 are stacked in this order;
- the $V_xZn_{1-x}$ layer 51 is in contact with the n-side group III-group V compound electrode layer 4;
- x represents a value of not less than 0.3 and not more than 0.99; and
- the $V_xZn_{1-x}$ layer 51 has a thickness of not less than 1 nanometer and not more than 5 nanometers.

Another aspect of the present disclosure provides a method for generating an electric power using a solar cell element, the method comprising:
- a step (a) of preparing the solar cell element according to item A1; and
- a step (b) of irradiating the p-type group III-group V compound semiconductor layer 31 and the n-type group III-group V compound semiconductor layer 32 with incident light through the $V_xZn_{1-x}$ layer 51 and through the n-side group III-group V compound electrode layer 4 so as to generate a voltage difference between the p-side electrode 53 and the $V_xZn_{1-x}$ layer 51.

The solar cell element may comprise a transparent conductive layer 52, wherein
the $V_xZn_{1-x}$ layer 51 is interposed between the transparent electrode layer 52 and the n-side group III-group V compound electrode layer 4.

Advantageous Effects of Invention

The present disclosure provides a new solar cell element having higher photoelectric conversion efficiency.

DESCRIPTION OF EMBODIMENTS

An embodiment of the present disclosure is described below with reference to the drawings.

Embodiment

Figure 1A:
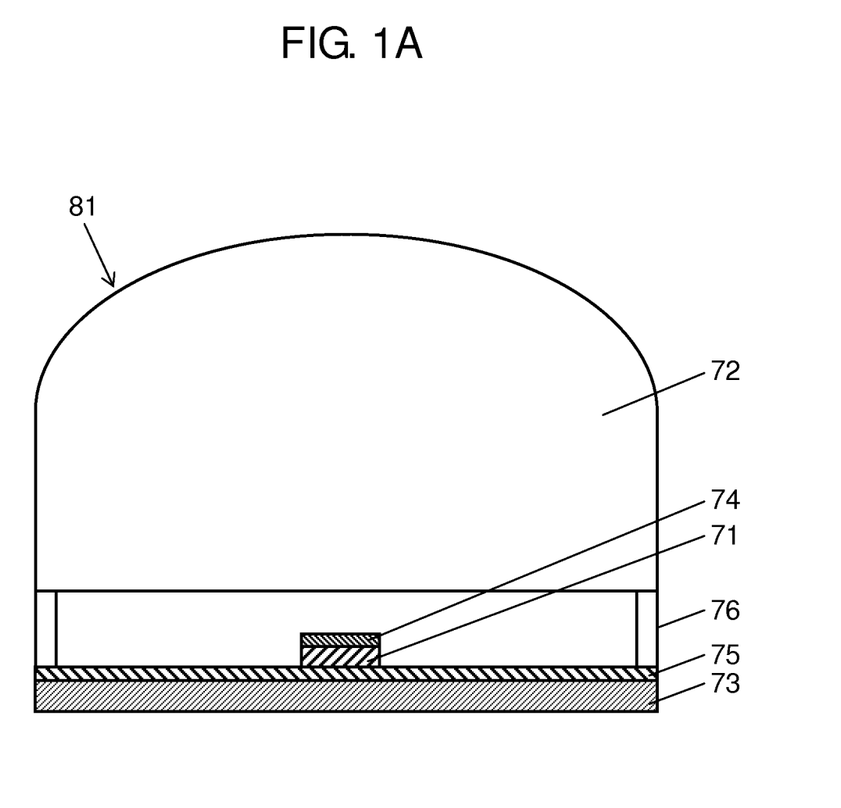
FIG. 1A shows a cross-sectional view of a solar cell device 81 according to an embodiment.

FIG. 1A shows a cross-sectional view of a solar cell device 81 according to the embodiment.

The solar cell device 81 comprises a solar cell element 71, a condenser lens 72, a cooling plate 73, an anti-reflection film 74, a wiring board 75, and a spacer 76. The wiring board 75 is provided on the cooling plate 73. The solar cell element 71 is provided on the wiring board 75. The spacer 76 is interposed between the condenser lens 72 and the cooling plate 73.

It is desirable that the cooling plate 73 be an aluminum plate or a copper plate.

It is desirable that the wiring board 75 be composed of a dielectric plate having a metal wiring on the surface thereof. A suitable material of this dielectric plate is epoxy resin.

The spacer 76 maintains the distance formed between the solar cell element 71 and the condenser lens 72 at a predetermined distance. Furthermore, it is desirable that the spacer 76 serve as an adhesive layer between the condenser lens 72 and the wiring board 75. Examples of the suitable material of the spacer 76 include glass and epoxy resin.

Figure 1B:
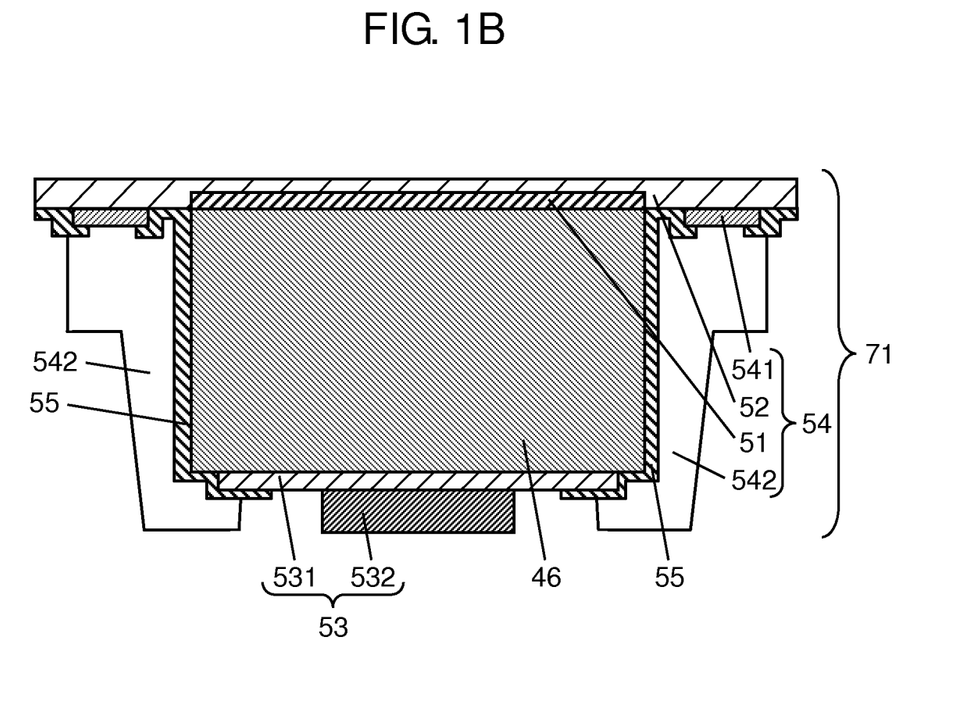
FIG. 1B shows a cross-sectional view of a solar cell element 71 according to the embodiment.

FIG. 1B shows a cross-sectional view of the solar cell element 71 according to the embodiment.

The solar cell element 71 comprises an obverse electrode 53, a power generation layer 46 and a reverse electrode 54.

The obverse electrode 53 serves as a p-side electrode. It is desirable that the obverse electrode 53 be composed of a p-side bus electrode layer 531 and a p-side electrode wiring part 532. It is desirable that the obverse electrode 53 further comprise a transparent electrode layer 52. An example of the material of the transparent electrode layer 52 is zinc oxide.

It is desirable that the reverse electrode 54 be composed of an n-side bus electrode layer 541 and an n-side electrode wiring part 542.

The obverse electrode 53 and the reverse electrode 54 are electrically and independently connected to metal wirings (not shown) provided on the wiring board 55. In more detail, the bottom surface of the p-side electrode wiring part 532 and the bottom surface of the n-side electrode wiring part 542 electrically and independently connected to the metal wirings.

Figure 1C:
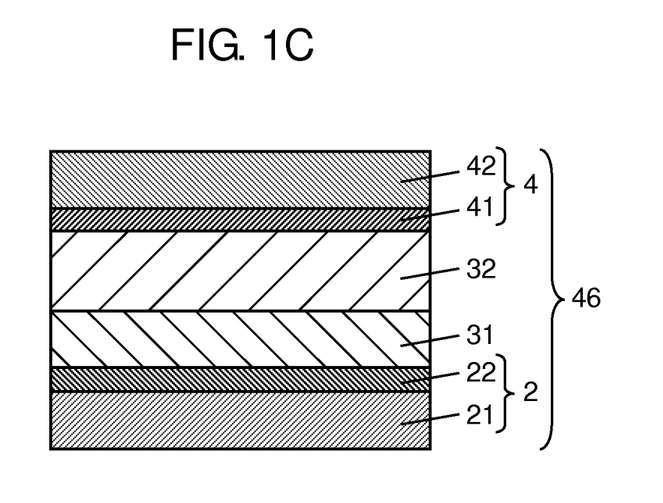
FIG. 1C shows a cross-sectional view of a power generation layer 46 according to the embodiment.

FIG. 1C shows a cross-sectional view of the power generation layer 46.

The power generation layer 46 comprises an n-side contact layer 42, an n-side window layer 41, an n-type emitter layer 32, a p-type base layer 31, a p-side window layer 22 and a p-side contact layer 21. These layers are stacked in this order. A p-side group III-group V compound electrode layer 2 includes the p-side contact layer 21 and a p-side window layer 22. A n-side group III-group V compound electrode layer includes n-side window layer 41 and the n-side contact layer 42. The n-type semiconductor layer comprises the n-side contact layer 42, the n-side window layer 41 and the n-type emitter layer 32. The p-type semiconductor layer comprises the p-type base layer 31, the p-side window layer 22, and the p-side contact layer 21. These layers may be formed by a conventional semiconductor crystal growth method such as a metalorganic chemical vapor deposition method (hereinafter, referred to as "MOCVD").

As shown in FIG. 1B and FIG. 1C, a $V_xZn_{1-x}$ layer 51 is interposed between the transparent electrode layer 52 and the n-type semiconductor layer. The $V_xZn_{1-x}$ layer 51 is in contact with the n-type semiconductor layer.

In more detail, the $V_xZn_{1-x}$ layer 51 is interposed between the transparent electrode layer 52 and the n-side contact layer 42. The $V_xZn_{1-x}$ layer 51 is in contact with the n-side contact layer 42.

The transparent electrode layer 52 may be coated with the anti-reflection film 74. A suitable material of the anti-reflection film 74 is titanium oxide or magnesium fluoride.

The $V_xZn_{1-x}$ layer 51 consists of an alloy of vanadium and zinc. The $V_xZn_{1-x}$ layer 51 may be formed by a sputtering method. The character "x" represents a value of not less than 0.3 and not more than 0.99. When x is less than 0.3, the photoelectric conversion efficiency is decreased. See the comparative example 1 which is described later. Similarly, the photoelectric conversion efficiency is decreased when x is more than 0.99. See the comparative example 2 which is described later.

The $V_xZn_{1-x}$ layer 51 has a thickness of not less than 1 nanometer and not more than 5 nanometers. When the $V_xZn_{1-x}$ layer 51 is not formed, the photoelectric conversion efficiency is decreased. See the comparative example 3 which is described later. When the $V_xZn_{1-x}$ layer 51 has a thickness of more than 5 nanometers, the photoelectric conversion efficiency is decreased. See the comparative example 4 which is described later.

A pn-junction is formed at the interface interposed between the p-type semiconductor layer and the n-type semiconductor layer. In more detail, the pn-junction is formed at the interface interposed between the p-type base layer 31 and the n-type emitter layer 32.

The n-side contact layer 42 forms an ohmic contact between the n-side window layer 41 and the reverse electrode 54. It is desirable that the material of the n-side contact layer 42 be n-type GaAs.

The n-side window layer 41 consists of an n-type group III-group V compound semiconductor having a lattice constant close to that of GaAs and having a greater bandgap than GaAs. Examples of the material of the n-side window layer 41 include n-type InGaP, n-type InAlP, and n-type InAlGaP.

The n-type emitter layer 32 consists of a group III-group V compound semiconductor capable of forming the pn-junction with the p-type base layer 31. Examples of the material of the n-type emitter layer 32 include n-type InGaAs, n-type GaAs and n-type InGaP.

The p-type base layer 31 consists of a group III-group V compound semiconductor capable of forming the pn-junction with the n-type emitter layer 32. Examples of the material of the p-type base layer 31 include p-type InGaAs, p-type GaAs, and p-type InGaP.

The p-side window layer 22 consists of a p-type group III-group V compound semiconductor having a lattice constant close to that of GaAs and having a greater bandgap than GaAs. Examples of the material of the p-side window layer 22 include p-type InGaP, p-type InAlGaP, and p-type InAlP.

The p-side contact layer 21 forms an ohmic contact between the p-side window layer 22 and the p-side bus electrode layer 531. An example of the material of the p-side contact layer 21 is a p-type group III-group V compound semiconductor such as p-type GaAs.

An isolation film 55 is formed on the peripheral surface of the power generation layer 46. Examples of a suitable material of the isolation film 55 include non-doped InGaP, silicon dioxide, and silicon nitride.

The obverse surface of the condenser lens 72 is irradiated with incident light. It is desirable that the incident light be sunlight. The incident light is focused on the solar cell element 71 by the condenser lens 72. It is desirable that the condenser lens 72 have a diameter of not less than 2 mm and not more than 10 mm, a thickness of not less than 1 mm and not more than 5 mm, and a refraction index of not less than 1.1 and not more than 2.0. It is desirable that the material of the condenser lens 72 be glass or resin having high transmittance.

The incident light that arrived at the solar cell element 71 through the anti-reflection film 74 penetrates the transparent electrode layer 52, the $V_xZn_{1-x}$ layer 51, the n-side contact layer 42, and the n-side window layer 41 in this order. Subsequently, the incident light is photoelectrically converted in the n-type emitter layer 32 and in the p-type base layer 31. This photoelectric conversion generates a voltage between the obverse electrode 53 and the $V_xZn_{1-x}$ layer 51.

EXAMPLES

The following experiment examples describe the present disclosure in more detail.

Example 1

A laminate 1 shown in FIG. 2 was prepared as below.

First, an AlAs sacrifice layer 44 having a thickness of 100 nanometers was formed by an MOCVD method on a non-doped GaAs substrate 45 having a diameter of 4 inches and a thickness of 450 micrometers.

Then, the laminate 1 was formed on the AlAs sacrifice layer 44 as below.

More particularly, the n-side contact layer 42 consisting of a Te-doped GaAs layer (dope concentration: $1.0 \times 10^{19}$, thickness: 20 nanometers) was formed by an MOCVD method on the AlAs sacrifice layer 44.

Next, the n-side window layer 41 consisting of a Si-doped InGaP layer (dope concentration: $1.0 \times 10^{18}$, thickness: 100 nanometers) was formed by an MOCVD method on the n-side contact layer 42.

The n-type emitter layer 32 consisting of a Si-doped GaAs layer (dope concentration: $1.0 \times 10^{18}$, thickness: 100 nanometers) was formed by an MOCVD method on the n-side window layer 41.

The p-type base layer 31 consisting of a Zn-doped GaAs layer (dope concentration: $1.0 \times 10^{16}$, thickness: 2.5 micrometers) was formed by an MOCVD method on the n-type emitter layer 32.

The p-side window layer 22 consisting of a Zn-doped InGaP layer (dope concentration: $1.0 \times 10^{19}$, thickness: 50 nanometers) was formed by an MOCVD method on the p-type base layer 31.

The p-side contact layer 21 consisting of a Zn-doped GaAs layer (dope concentration: $1.0 \times 10^{19}$, thickness: 20 nanometers) was formed by an MOCVD method on the p-side window layer 22.

Figure 2:
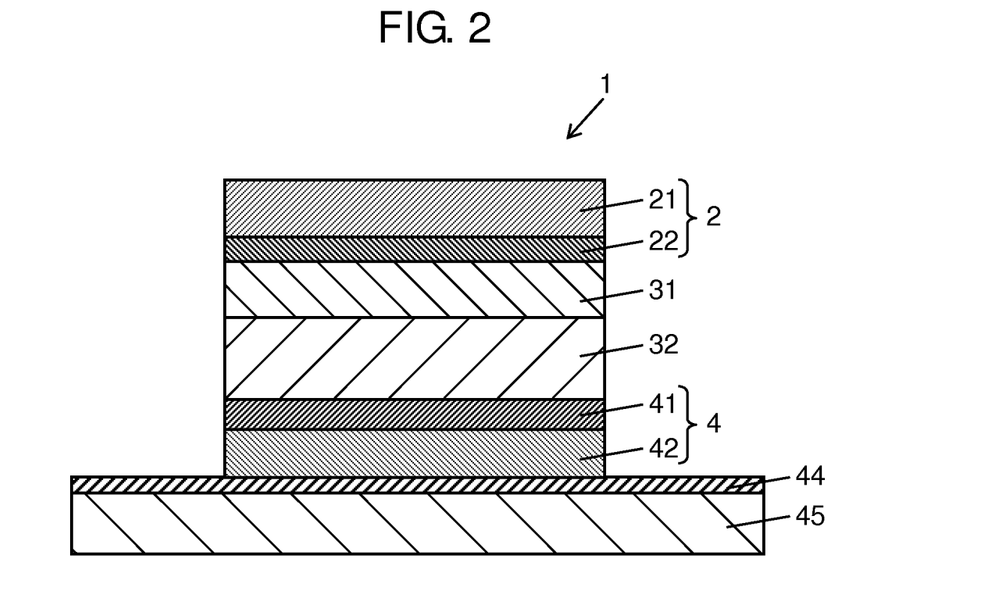
FIG. 2 shows a cross-sectional view for depicting one step included in a method for fabricating the solar cell element 71.

In this way, the laminate 1 shown in FIG. 2 was obtained.

Figure 3:
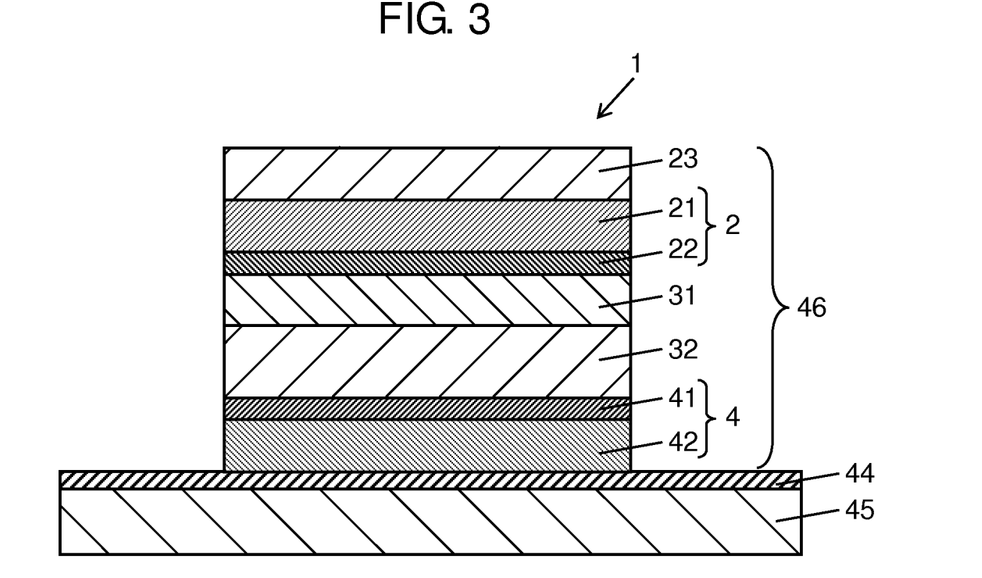
FIG. 3 shows a cross-sectional view for depicting one step subsequent to FIG. 2 included in the method for fabricating the solar cell element 71.

Then, as shown in FIG. 3, a resist film 23 of 500 square micrometers was formed by photolithography on the p-side contact layer 21. Using this resist film 23 as a first mask, an unnecessary part of the laminate 1 was removed by an ICP plasma etching technique. In this ICP plasma etching technique, a gaseous mixture of $BCl_3$ and $SF_6$ was used. The surface area S of the laminate 1 was 25,000 square micrometers.

Subsequently, the resist film 23 was removed with a detachment liquid so as to obtain the power generation layer 46.

Figure 4:
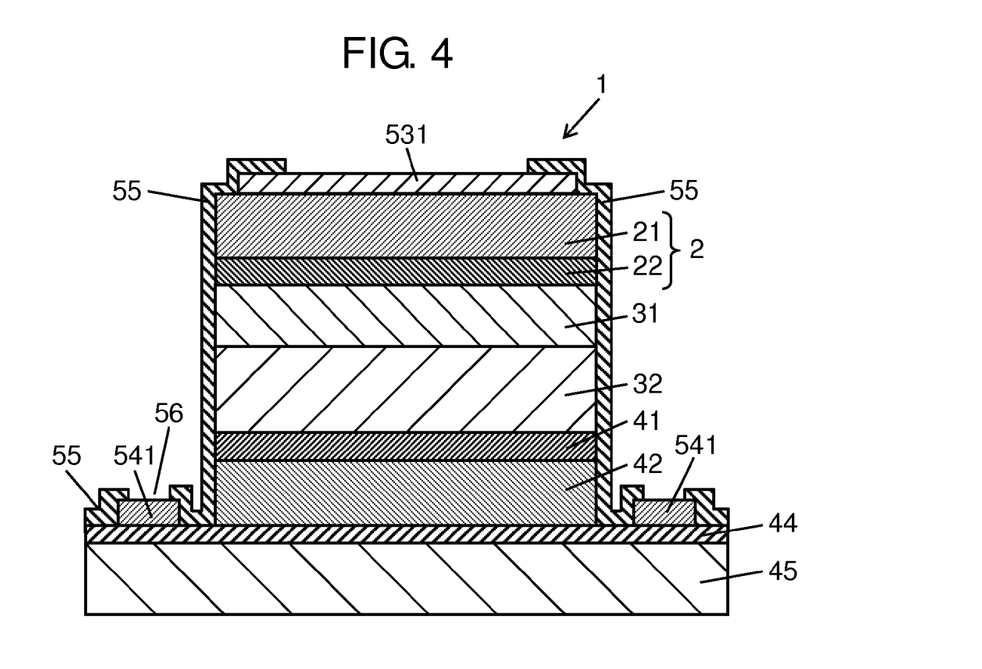
FIG. 4 shows a cross-sectional view for depicting one step subsequent to FIG. 3 included in the method for fabricating the solar cell element 71.

Then, as shown in FIG. 4, after a resist film (not shown) was formed on the AlAs sacrifice layer 44, a titanium film having a thickness of 50 nanometers and a gold film having a thickness of 250 nanometers were formed by an electron beam evaporation method on a part of the upper surface of the laminate 1 to form the p-side bus electrode layer 531.

Similarly, after a resist film (not shown) was formed on the upper surface of the laminate 1, a titanium film having a thickness of 50 nanometers and a gold film having a thickness of 250 nanometers were formed by an electron beam evaporation method on a part of the sacrifice layer 44 to form the n-side bus electrode layer 541.

Subsequently, these resist films were removed. Then, the isolation film 55 was formed on the p-side bus electrode layer 531, on the n-side bus electrode layer 541 and on the side wall of the laminate 1. This isolation film 55 was formed of a SiN film having a thickness of 300 nanometers. Then, a resist film was formed, and an opening 56 was provided in the isolation film 55 by dry etching. The n-side bus electrode layer 541 was exposed from the opening 56. In this way, the laminate 1 shown in FIG. 4 was obtained.

Figure 5:
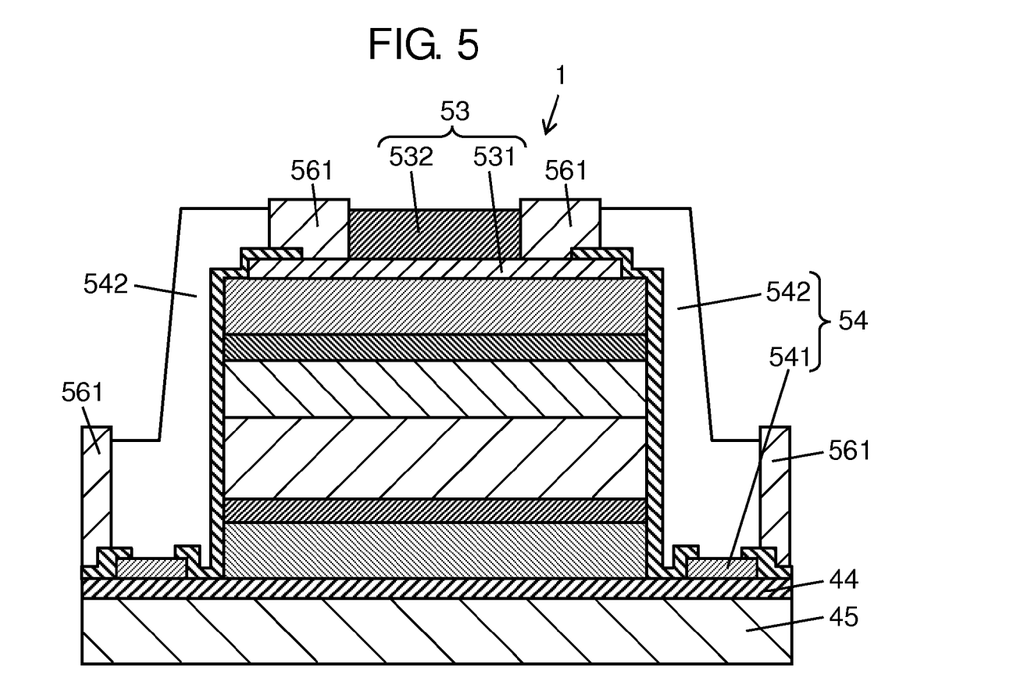
FIG. 5 shows a cross-sectional view for depicting one step subsequent to FIG. 4 included in the method for fabricating the solar cell element 71.

As shown in FIG. 5, a second mask 561 was formed by photolithography on the isolation film 55. A titanium film having a thickness of 50 nanometers and a gold film having a thickness of 250 nanometers were formed on the upper surface of the laminate 1 by an electron beam evaporation method to form the p-side electrode wiring part 532. Similarly, a titanium film and a gold film were formed on the upper surface of the n-side bus electrode layer 541 to form the n-side electrode wiring part 542.

Figure 6:
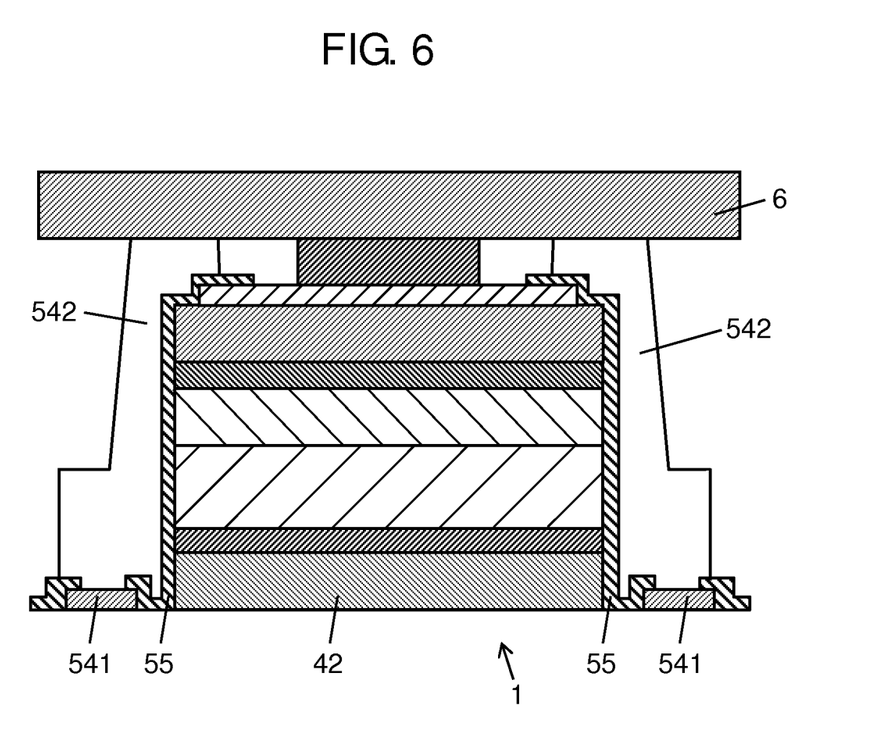
FIG. 6 shows a cross-sectional view for depicting one step subsequent to FIG. 5 included in the method for fabricating the solar cell element 71.

As shown in FIG. 6, after the laminate 1 was inverted, the second mask 561 was removed. Wax was applied to the upper surfaces of the p-side electrode wiring part 532 and the n-side electrode wiring part 542 by a spin-coater method. After the wax was dried, a supporting substrate 6 was fixed on the wax. The AlAs sacrifice layer 44 was removed by wet etching using hydrofluoric acid to expose the n-side contact layer 42 from the bottom of the laminate 1.

Figure 7:
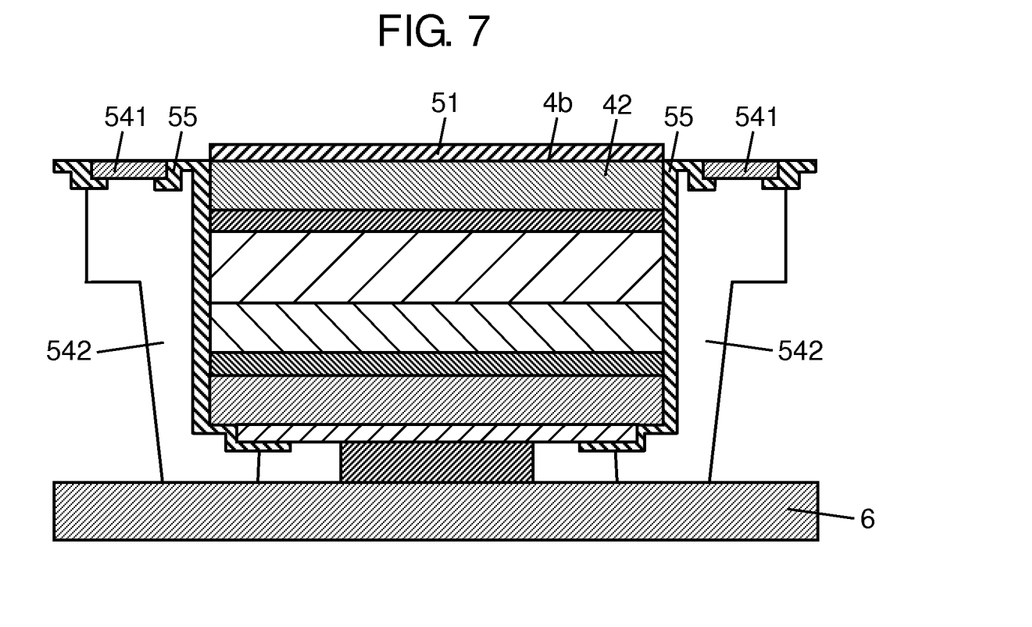
FIG. 7 shows a cross-sectional view for depicting one step subsequent to FIG. 6 included in the method for fabricating the solar cell element 71.

As shown in FIG. 7, after the laminate 1 was inverted again, the $V_{0.99}Zn_{0.01}$ layer 51 was formed on the n-side contact layer 42. More particularly, a resist film (not shown) of 500 square micrometers was formed by photolithography. Subsequently, the $V_{0.99}Zn_{0.01}$ layer 51 was formed by a sputter deposition method. The $V_{0.99}Zn_{0.01}$ layer 51 had a thickness of 5 nanometers. Then, the resist film was removed.

Figure 8:
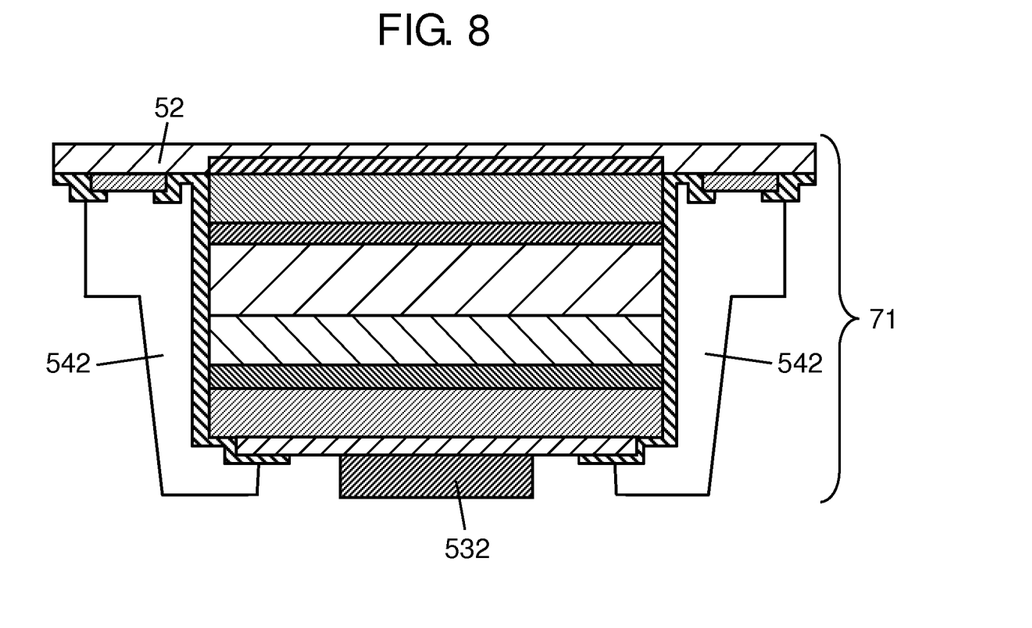
FIG. 8 shows a cross-sectional view for depicting one step subsequent to FIG. 7 included in the method for fabricating the solar cell element 71.

Finally, as shown in FIG. 8, the transparent electrode layer 52 was formed by a pulsed laser deposition method on the $V_{0.99}Zn_{0.01}$ layer 51. The material of the transparent electrode layer 52 was zinc oxide. In this way, the $V_{0.99}Zn_{0.01}$ layer 51 was electrically connected to the n-side bus electrode layer 541. The transparent electrode layer 52 had a thickness of 300 nanometers. The transparent electrode layer 52 had a gallium concentration of 2% by weight.

In this way, the solar cell element 71 was obtained.

As shown in FIG. 1A, the solar cell device 81 was build with the condenser lens 72 and the obtained solar cell element 71.

More particularly, the anti-reflection film 74 consisting of a $MgF_2$ film having a thickness of 140 nanometers was formed on the transparent electrode layer 52 by an electron beam evaporation method.

As shown in FIG. 1A, the solar cell element 71 was set on the cooling plate 73 comprising the wiring board 75 and the spacer 76 on the surface thereof. Two electrical wirings (not shown) electrically connected to the obverse electrode 53 and the reverse electrode 54 were formed in advance on the wiring board 75.

The solar cell element 71 was fixed to the focal point of the condenser lens 72 to obtain the solar cell device 81.

During the measurement of the photoelectric conversion efficiency, the condenser lens 72 was irradiated with pseudo-sunlight which is described later.

The photoelectric conversion efficiency of the solar cell 81 was calculated as below.

The condenser lens 72 was irradiated with the pseudo-sunlight having a power energy of 100 mW/cm$^2$.

The pseudo-sunlight was radiated from a lamp that is a combination of a xenon lamp (available from Wacom Electric Co., Ltd.) of 500 watts and a halogen lamp (available from Wacom Electric Co., Ltd.) of 400 watts.

The open circuit voltage Voc when the obverse electrode 53 and the reverse electrode 54 were electrically opened was measured.

The short-circuit current Isc when the obverse electrode 53 and the reverse electrode 54 were short-circuited was measured.

Figure 9:
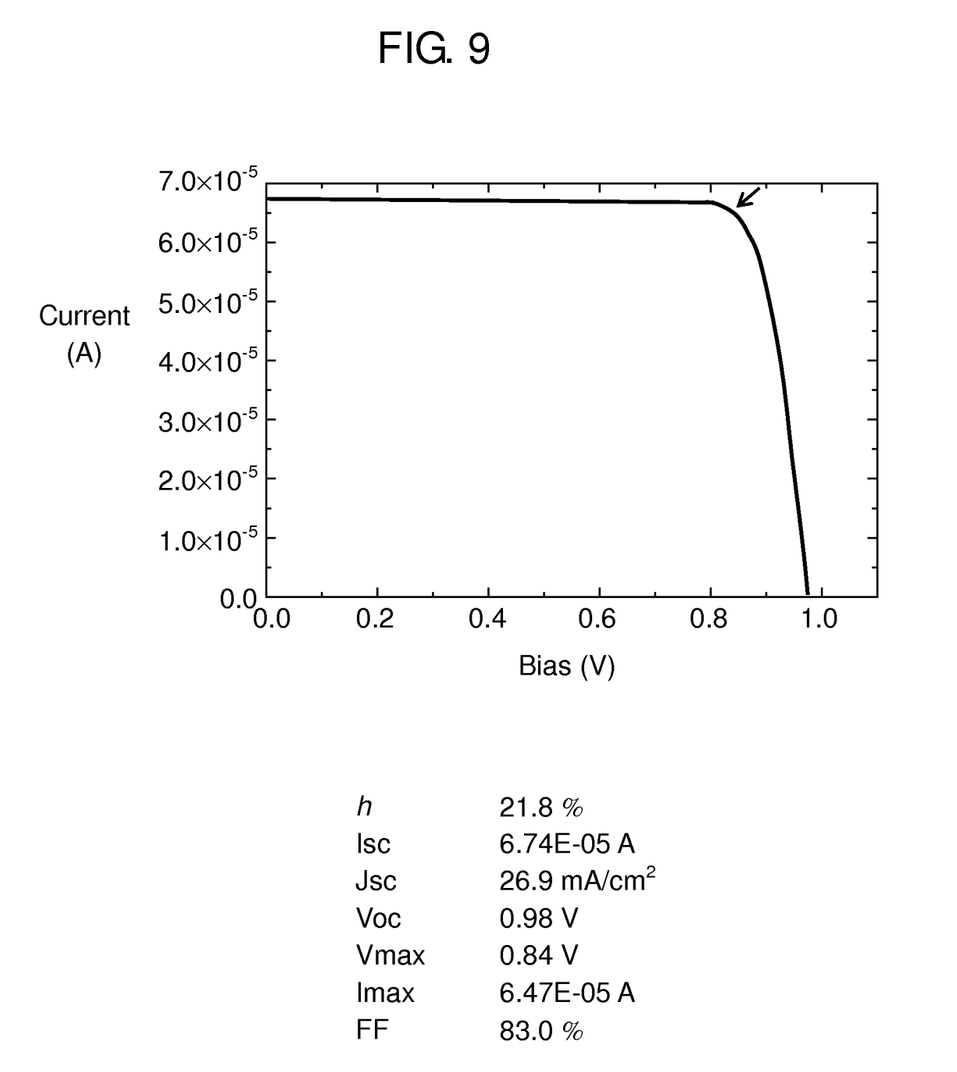
FIG. 9 shows an I-V-curve obtained in the example 1.

An I-V curve as shown in FIG. 9 was obtained using a solar simulator (available from Wacom Electric Co., Ltd., Trade name: Super Solar simulator WXS-90S-L2).

On the basis of FIG. 9, the fill factor (hereinafter, referred to as "FF") was obtained in accordance with the disclosure of Non Patent Literature 2.

[Non Patent Literature 2] Jenny Nelson (2003), The physics of Solar Cells, Imperial college press, pp. 11-13.

The fill factor FF is calculated in accordance with the following math formula.

$$FF = \frac{V_{max} \cdot I_{max}}{V_{oc} \cdot I_{sc}}$$ [Math 1]

In the formula, Vmax means the voltage when the V·I value of the I-V curve is maximum in FIG. 9 (See the arrow in FIG. 9).

Imax means the electric current when the V·I value of the I-V curve is maximum in FIG. 9 (See the arrow in FIG. 9).

The photoelectric conversion efficiency is calculated in accordance with the following formula.

Photoelectric conversion efficiency=$Voc \cdot Jsc \cdot FF$

In the formula, $Jsc=Isc/S$ $S$(effective light-receiving surface area)=25,000 square micrometers The results are shown in Table 1.

Example 2

An experiment similar to the example 1 was performed, except that the $V_{0.99}Zn_{0.01}$ layer had a thickness of 1 nanometer. The results are shown in Table 1.

Example 3

An experiment similar to the example 1 was performed, except that x=0.3. The results are shown in Table 1.

Example 4

An experiment similar to the example 1 was performed, except that x=0.3 and that the $V_{0.7}Zn_{0.3}$ layer had a thickness of 1 nanometer. The results are shown in Table 1.

Comparative Example 1

An experiment similar to the example 1 was performed, except that x=0.01. The results are shown in Table 1.

Comparative Example 2

An experiment similar to the example 1 was performed, except that x=1. The results are shown in Table 1.

Comparative Example 3

An experiment similar to the example 1 was performed, except that the $V_xZn_{1-x}$ layer was not formed. The results are shown in Table 1.

Comparative Example 4

An experiment similar to the example 1 was performed, except that the $V_{0.99}Zn_{0.01}$ layer had a thickness of 20 nanometers. The results are shown in Table 1.

TABLE 1

| | Composition of the $V_xZn_{1-x}$ layer | Thickness of the $V_xZn_{1-x}$ layer | Photoelectric conversion efficiency [%] |
|---|---|---|---|
| Example 1 | $V_{0.99}Zn_{0.01}$ | 5 nm | 21.8 |
| Example 2 | $V_{0.99}Zn_{0.01}$ | 1 nm | 22.3 |
| Example 3 | $V_{0.3}Zn_{0.7}$ | 5 nm | 21.5 |
| Example 4 | $V_{0.3}Zn_{0.7}$ | 1 nm | 21.8 |
| Comparative example 1 | $V_{0.01}Zn_{0.99}$ | 5 nm | 20.4 |
| Comparative example 2 | V | 5 nm | 20.6 |
| Comparative example 3 | — | None | 18.9 |
| Comparative example 4 | $V_{0.3}Zn_{0.7}$ | 20 nm | 18.6 |

As is clear from Table 1, high photoelectric conversion efficiency is provided when both of the following requirements A and B are satisfied:

(Requirement A): The value of x is not less than 0.3 and not more than 0.99; and (Requirement B): The $V_xZn_{1-x}$ layer 51 has a thickness of not less than 1 nanometer and not more than 5 nanometers.

INDUSTRIAL APPLICABILITY

The present disclosure provides a solar cell element having higher photoelectric conversion efficiency.

REFERENCE SIGNS LIST

1: laminate
2: p-side group III-group V compound electrode layer
21: p-side contact layer
22: p-side window layer
31: p-type group III-group V compound semiconductor layer
31: p-type base layer
32: n-type group III-group V compound semiconductor layer
32: n-type emitter layer
4: n-side group III-group V compound electrode layer
41: n-side window layer
42: n-side contact layer
44: sacrifice layer
45: substrate
46 power generation layer
51: $V_xZn_{1-x}$ layer
52: transparent electrode layer
53: obverse electrode
531: p-side bus electrode layer
532: p-side electrode wiring part
54: reverse electrode
541: n-side bus electrode layer
542: n-side electrode wiring part
55: isolation film
56: opening
561: second mask
6: supporting substrate
71: solar cell element
72: condenser lens
73: cooling plate
74: anti-reflection film
75: wiring board
76: spacer
81: solar cell

The invention claimed is:

1. A solar cell element comprising:

a p-side electrode;

a p-type group III-group V compound semiconductor layer;

an n-type group III-group V compound semiconductor layer;

an n-side group III-group V compound electrode layer; and a $V_xZn_{1-x}$ layer; wherein the p-side electrode is electrically connected to the p-type group III-group V compound semiconductor layer;

the p-type group III-group V compound semiconductor layer, the n-type group III-group V compound semiconductor layer, the n-side group III-group V compound electrode layer, and the $V_xZn_{1-x}$ layer are stacked in this order;

the $V_xZn_{1-x}$ layer is in contact with the n-side III-group V compound electrode layer;

x represents a value of not less than 0.3 and not more than 0.99; and the $V_xZn_{1-x}$ layer has a thickness of not less than 1 nanometer and not more than 5 nanometers.

2. The solar cell element according to claim 1, further comprising a transparent electrode layer, wherein the $V_xZn_{1-x}$ layer is interposed between the transparent electrode layer and the n-side group III-group V compound electrode layer.

3. A method for generating an electric power using a solar cell element, the method comprising:

a step (a) of preparing the solar cell element according to claim 1; and a step (b) of irradiating the p-type group III-group V compound semiconductor layer and the n-type group III-group V compound semiconductor layer with incident light through the $V_xZn_{1-x}$ layer and through the n-side group III-group V compound electrode layer so as to generate a voltage difference between the p-side electrode and the $V_xZn_{1-x}$ layer.

4. The method according to claim 3, wherein the solar cell element further comprises a transparent electrode layer, and the $V_xZn_{1-x}$ layer is interposed between the transparent electrode layer and the n-side group III-group V compound electrode layer.

* * * * *